United States Patent [19]
Nilsson

[11] Patent Number: 5,568,498
[45] Date of Patent: Oct. 22, 1996

[54] LASER DEVICE WITH LASER STRUCTURES CONNECTED IN SERIES IN AN OPTICAL CAVITY

[75] Inventor: Olle Nilsson, Fjarås, Sweden

[73] Assignee: Telefonaktiebolaget LM Ericsson, Stockholm, Sweden

[21] Appl. No.: 303,624

[22] Filed: Sep. 9, 1994

[30] Foreign Application Priority Data

Sep. 10, 1993 [SE] Sweden ................... 9302951

[51] Int. Cl.$^6$ ................ H01S 3/18; H01S 3/25
[52] U.S. Cl. ................ 372/43; 372/44; 372/50; 372/92; 372/68
[58] Field of Search .............. 372/43, 50, 44, 372/92, 38, 68; 257/88; 359/344, 345

[56] References Cited

U.S. PATENT DOCUMENTS

| | | |
|---|---|---|
| 4,316,156 | 2/1982 | Scifres et al. . |
| 4,573,161 | 2/1986 | Sakai et al. . |
| 4,602,370 | 7/1986 | Tsang . |
| 4,817,103 | 3/1989 | Holonyak, Jr. et al. . |
| 4,908,832 | 3/1990 | Baer . |
| 4,912,533 | 3/1990 | Takahashi . |
| 4,916,712 | 4/1990 | Bender . |
| 5,133,809 | 7/1992 | Sichanugrist et al. . |
| 5,212,706 | 5/1993 | Jaln ............................ 372/50 |

FOREIGN PATENT DOCUMENTS

| | | |
|---|---|---|
| 239352 | 9/1987 | European Pat. Off. . |
| 370830 | 5/1990 | European Pat. Off. . |
| 475373 | 3/1992 | European Pat. Off. . |
| 56-134792 | 1/1981 | Japan ......................... 372/50 |
| 9215136 | 9/1992 | WIPO ......................... 372/50 |

OTHER PUBLICATIONS

P. J. Edwards, "Low–Noise Optoelectronic Amplifier Using Sub–Shot Noise Light," Electronics Letters, vol. 29, No. 3, pp. 299–301 (Feb. 4, 1993).

J. P. van der Ziel et al., "Integrated Multilayer GaAs Lasers Separated by Tunnel Junctions," Appl. Phys. Lett., vol. 41, No. 6, pp. 499–501 (Sep. 15, 1982).

Primary Examiner—Rodney B. Bovernick
Assistant Examiner—Robert McNutt
Attorney, Agent, or Firm—Burns, Doane, Swecker & Mathis, L.L.P.

[57] ABSTRACT

An edge emitting laser device with at least two laser structures arranged in one and the same optical cavity. The laser structures are substantially arranged in the optical direction of propagation and each laser structure comprises an active region, said active regions being electrically connected in series.

16 Claims, 2 Drawing Sheets

LASER DEVICE WITH LASER STRUCTURES CONNECTED IN SERIES IN AN OPTICAL CAVITY

BACKGROUND

The present invention relates to a laser device which is edge emitting and comprises two or more laser structures in one and the same optical cavity. Devices of this kind can e.g. be used in various light transmission systems such as in fiber optical transmission systems etc. For most diode lasers the threshold current, i.e. the lowest electrical feeding current for which lasering occurs is high whereas the electrical feeding impedance is low. That diode lasers normally has very low electrical input impedances among others makes the construction of broadband feeding circuits under maintenance of a high efficiency difficult.

A number of different laser devices with two or more active regions are known. Examples thereof are e.g. so called strip lasers. The reason for them having several active regions is however to increase the power intensity. The active regions therein are furthermore not electrically connected in series.

From for example U.S. Pat. No. 4,602,370 a laser device is known which has several active layers in a large optical cavity. The different active layers are arranged vertically with intermediate so called distance layers. These active layers are not electrically connected in series and the optical losses are high.

In "Intergrated multilayers GaAs lasers separated by tunnel junctions" by J P van der Thiel and W T Tsang, Applied Physics Letter 41 (6), 15 Sep., 1982 three so called double heterostructure GaAs-laserdiodes are connected in series through reversed tunnel junctions. Also in this device the active layers are arranged vertically but the arrangement does not form a vertical optical cavity. Since the active layers in such a device are arranged on a relatively large distance from each other, which as such is necessary in this case to avoid optical losses in the contact surfaces or in the tunnel junctions, the different optical light signals from the different lasers will be incoherent since the lasers are not connected to each other.

As mentioned above, in well known devices such as for example diodelasers, the electrical input impedance is very low and the threshold current for lasering is high. This has as a consequence considerable difficulties with the construction of broadband feeding circuits where it is desireable that the efficiency also is high. At the same time impedance adaption through various transmission wires or others gets difficult or impossible.

With known devices the dynamic impedance is as low as a few ohms, often only a fraction of one ohm which is very hard to adapt to for example 50 Ω due to the large reflection.

In applicant's copending U.S. patent application "Surface emitting laser device with a vertical cavity" application Ser. No. 08/303,623, filed Sep. 9, 1994, a device is described through which a low treshold current and a high impedance is obtained wherein further the resistive, electrical losses which are introduced through the electrical reflection devices, are reduced. Applicant's copending U.S. patent application "Optical amplifying device", application Ser. No. 08/303,621, filed Sep. 9, 1994 an amplifying device is described which uses laser structures or active regions connected in series for example in a longitudinal optical cavity according to the present invention or a vertical optical cavity in accordance with the abovementioned application. Both of these copending U.S. patent applications are incorporated by reference in this application.

SUMMARY

It is an object with the present invention to provide a laser device as initially referred to through which it is possible to lower the threshold current at the same time as the electrical feeding impedance can be increased or to lower the threshold current and increase the voltage drop. A further object of the invention is to reduce the threshold current while maintaining the power. It is also an object with invention to enable adaption of the impedance upwards. Furthermore it is an object of the invention to provide a device which gives a good and even better amplification without increasing the voltage drop. Another object with invention is to provide a device where no extra conducting junctions are introduced, i.e. more than those which are normally present, i.e. a device where there are no difficulties of the further optical losses. It is also an object with invention to provide a high resistive laser device with a large voltage drop and a large dynamic impedance. It is also an object with the invention to provide a device which is easy and cheap to fabricate as well as it has to be easy to use and have a broad field of application.

These as well as other objects are achieved through a device wherein each laser structure comprises an active region which regions are electrically connected in series and wherein the laser structures are substantially aligned in the optical direction of propagation.

According to an advantageous embodiment there are no conducting junctions between the laser structures. According to a particular embodiment the optical cavity is substantially longitudinal. Particularly, according to one embodiment, the outer surfaces of the device comprise cleaved, reflective surfaces. Preferably the surfaces of the laser structures which form a boundary towards another laser structure are provided with an antireflective coating or similar. According to a particular embodiment the device comprises a lower electrode and an upper electrode which are divided into a number of laser structures which are sufficiently electrically isolated from each other to be electrically connected in series. Still further the laser structures are arranged so closely to each other that substantially no optical losses are produced. Particularly the device comprises n structures connected in series so that upon injection of a current $I_0$ in one of the laser structures, n voltage drops in series are obtained. This corresponds substantially to the same power as upon injection of $n \times I_0$ in a conventional, known structure. According to an advantageous embodiment the lower electrode is highly doped. According to a particularly advantageous embodiment the lower electrode of the laser structure is connected to the upper electrode of the adjacent laser structure through a wire, cable or similar. According to an alternate embodiment the wire comprises a structure which is produced through metal deposition and etching. According to one embodiment the laser device comprises four laser structures connected in series. However, of course there can be fewer as well as more laser structures. According to one embodiment the division regions between the laser structures are formed by regions with a high resistivity. The laser structures may according to one embodiment comprise conventional laser structures. According to an advantageous embodiment the device forms a diode laser structure. According to a particular embodiment the laser device may comprise a DBR-laser or a DFB-laser which as such is constructed according to the invention.

BRIEF DESCRIPTION OF THE DRAWINGS

The invention will in the following be further described in a non-limiting way under reference to the accompanying drawings wherein.

DETAILED DESCRIPTION

Figure 1:
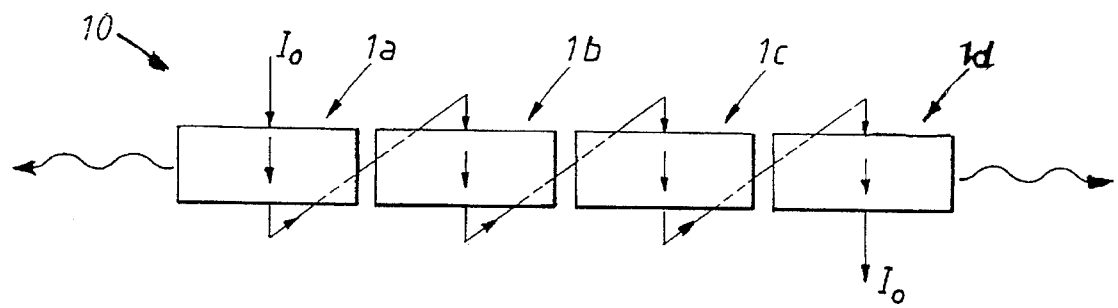
FIG. 1 schematically illustrates a laser device with four active regions connected in series.
Figure 2:
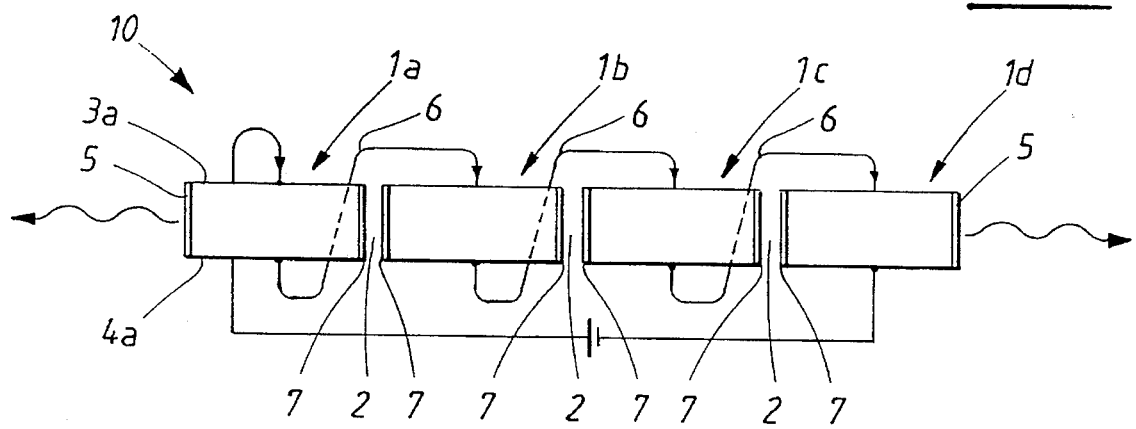
FIG. 2 illustrates a device with four laser structures within one and the same cavity connected to a voltage source.
Figure 3A:
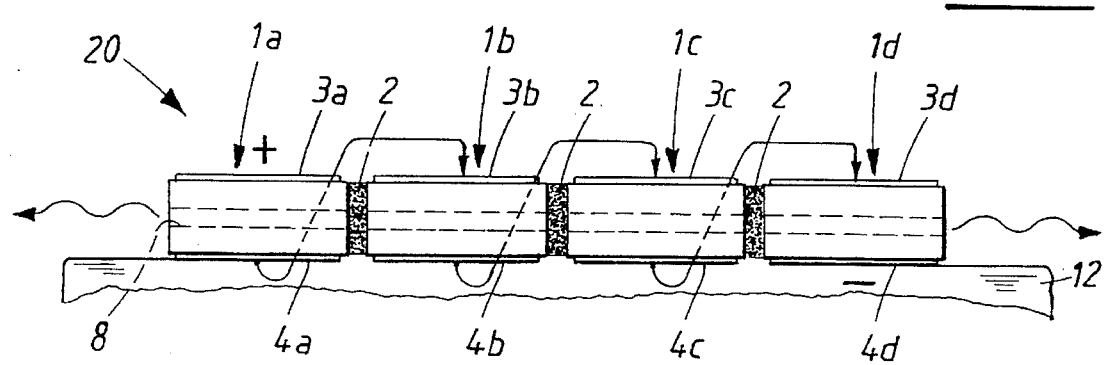
FIG. 3a illustrates a device in an integrated form.
Figure 3B:
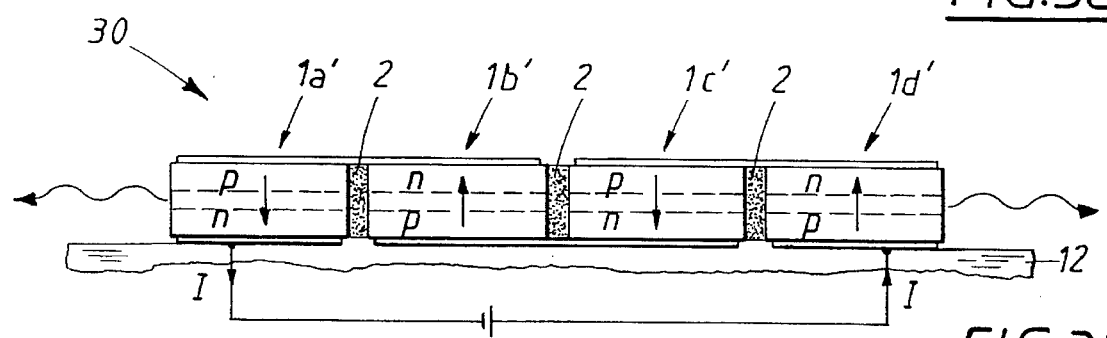
FIG. 3b illustrates an alternate embodiment of the device in an integrated form with a longitudinal connection in series.
Figure 4:
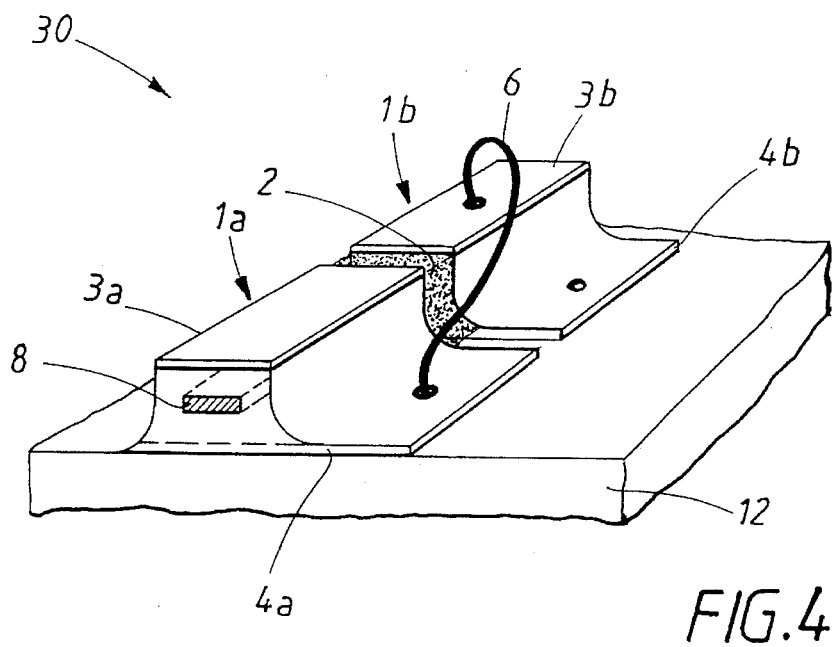
FIG. 4 shows an example of contacting in the lateral direction between different laser structures.

FIG. 1 illustrates schematically a laser device 10 according to the invention with four laser structures or active regions 1a, 1b, 1c, 1d connected in series. (The number of structures can of course be lower as well as higher.) In an ideal case each electron that this injected to an active region generates a photon. Each electron that is injected to the outer contact of the device, i.e. in the shown example the first laser structure 1a, will give rise to an injected photon in each one of the further active regions, i.e. in each laser structure 1b, 1c, 1d and consequently it would ideally give rise to four photons. The result thereof will be that for the same optical output power, four times lower feeding current and four times higher feeding voltage is required as compared to a conventional arrangement wherein the structures are connected in parallel. Then the feeding impedance will be 16 times higher and the threshold current four times lower. In FIG. 2 is shown in a somewhat more detailed manner a laser device with four laser structures 1a, 1b, 1c, 1d within one and the same longitudinal optical cavity. The outer surfaces 5,5 on the two outermost laser structures 1a, 1d are provided with cleaved reflecting surfaces whereas those surfaces on the laser structures which are arranged adjacent to another laser structure are provided with an antireflective coating 7 or similar. The outer laser structures 1a, 1d may for example be connected to a battery or a voltage source and the bottom electrode 4a, 4b, 4c, 4d of a laser structure is connected through a wire or a conductor 6 to the upper electrode 3b, 3c, 3d of the adjacent laser structure 1b, 1c, 1d, the lower electrode 4b, 4c, 4d in turn being connected to the upper electrode 3c, 3d ... of the next laser structure etc. The laser light is as shown in the figure emitted lengthwise. In FIG. 3a is illustrated an example of an integrated form with four upper electrodes 3a, 3b, 3c, 3d and four lower electrodes 4a, 4b, 4c, 4d. The laser structures are arranged on a substrate 12. The lower electrode layers are highly doped and the regions between the different laser structures 1a, 1b, 1c, 1d are regions with a high resistivity which for an example can be obtained through ion implantation or etched grooves which are filled with an isolating material 2. These should have a reflective index which is substantially of the same order of magnitude as the reflective index of the laser material in order to avoid (optical) reflections. The laser waveguide comprises active regions corresponding to each laser structure 1a, 1b, 1c, 1d under the upper electrodes. In FIG. 3b is schematically illustrated an alternative embodiment wherein instead the + and − electrodes alternate as upper and lower electrode respectively. In this case must however the doping be selective, i.e. p-n-junctions have to be switched etc. In FIG. 4 is more clearly illustrated how the contacting for example can be effected in the lateral direction wherein an active layer 8 is arranged between the upper and lower electrodes 3a, 3b; 4a, 4b respectively and the laser structure may in other respects form a conventional laser structure. As mentioned above the regions between the laser structures 1a, 1b, 1c, 1d comprise an isolating material 2 and a "wire" 6 is connected between a bottom contact 4a of the laser structue 1a and an upper contact 3b of the next following laser structure 1b. This wire or conductor 6 may according to an alternative embodiment be replaced by a structure which for example is fabricated through metal deposition and etching etc. Advantageously the device comprises a so called monomode structure. The laser structures 1a, 1b, 1c, 1d have to be arranged so closely to each other that substantially no optical losses occur. A number of different ways of fabrication are possible, for example either different, more or less conventional laser structures may be interconnected or two electrodes, an upper electrode and a lower electrode may be split up. These must however be electrically isolated from each other which as mentioned above may be achieved through the isolating material. This can be done in a number of different ways which as such are known. Upon feeding with a current $I_0$, 4 voltage drops in series are obtained which gives rise to the same power as if $4 \times I_0$ is injected to a conventional diode laser with four regions electrically connected in parallel. Through the invention it may be possible to decrease the threshold current for example four times at the same time as the electrical impedance can be increased approximately 16 times. Through the invention no further conducting junctions are introduced and then no further optical losses are produced. The laser device will be more highly resistive than conventional laser devices whereas the voltage drop will be larger. Thereby a dynamic impedance of for example 50 Ω instead of 1 Ω is obtained.

Figure 5A:
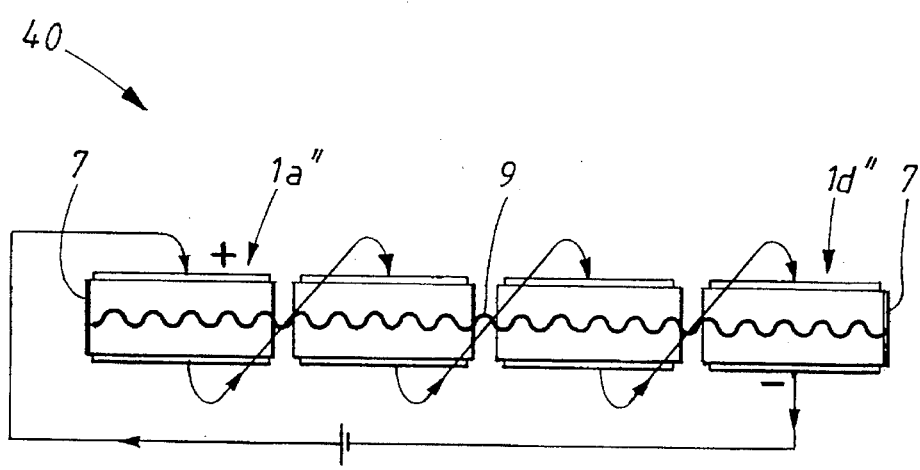
FIG. 5a illustrates schematically the application of the invention to a DFB-laser and FIG. 5b illustrates schematically the application of the invention to a DBR-laser.
Figure 5B:
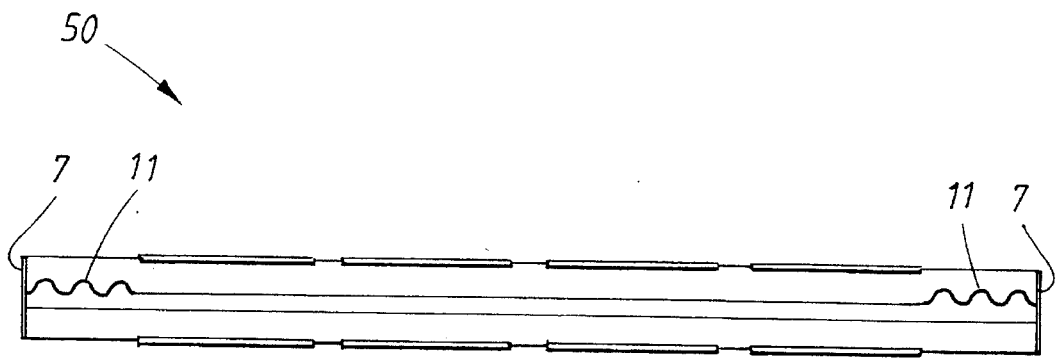

The invention can of course be applied to different kinds of DFB-lasers as well as different kinds of DBR-lasers which very schematically is illustrated in FIGS. 5a and 5b respectively.

In FIG. 5a the application of the principle to DFB-lasers is illustrated. The outer laser structures 1a" and 1d" respectively are provided with an antireflective coating 7 or they have undergone an antireflection treatment on the outer sides and a grating 9 runs through the laser device 40.

FIG. 5b illustrates the application to a DBR-laser and 11 illustrate Bragg mirrors. In another aspect the DFB-lasers and the DBR-lasers respectively are formed in a manner known per se.

In the shown embodiments the laser device comprises four active regions or four laser structures connected in series. The invention is of course not limited thereto but the number of laser structures connected in series can be fewer as well as more. Also in other aspects the invention is not limited to the shown embodiments but can be freely varied within the scope of the claims.

What is claimed is:

1. An edge emitting laser device with at least two in the same optical cavity arranged laser structures, wherein the laser structures are substantially aligned in an optical direction of propagation; each laser structure comprises an active region; the active regions are separately formed and electrically connected in series; and outer surfaces of the device comprise cleaved reflecting surfaces, and those surfaces of each laser structure which form a border to another laser structure are antireflective.

2. A device as in claim 1, wherein the laser structures are sufficiently electrically isolated from each other to be effectively connected electrically in series by contacts or similar.

3. A device as in claim 2, wherein the optical cavity is substantially longitudinal.

4. A device as in claim 2, wherein outer surfaces of device comprise cleaved, reflecting surfaces.

5. A device as in claim 1, wherein the device comprises a lower electrode and an upper electrode between which a laser waveguide with active regions is arranged, which electrodes are divided into a number of electrically isolated laser structures which are electrically connected in series.

6. A device as in claim 5, wherein the laser structures of the device are arranged so close to each other that substantially no optical losses occur.

7. A device as in claim 5, wherein the device comprises n laser structures and upon injection of $I_0$ to one of the structures, n voltage drops in series are obtained.

8. A device as in claim 5, wherein each lower electrode is highly doped.

9. A device as in claim 5, wherein the lower electrode of a laser structure is connected to the upper electrode of an adjacent laser structure via a conductor.

10. A device as in claim 9, wherein the conductor comprises a structure fabricated through metal deposition and etching.

11. A device as in claim 1, wherein border regions between the laser structures comprise areas with a high resistivity.

12. A device as in claim 1, wherein the device comprises four laser structures.

13. A device as in claim 1, wherein each laser structure comprises a conventional laser structure.

14. An edge emitting laser device, comprising at least two laser structures arranged in one optical cavity, wherein the laser structures are substantially aligned in an optical direction of propagation, each laser structure comprises an active region, the active regions are electrically connected in series, the laser structures are sufficiently electrically isolated from each other to be effectively connected electrically in series by contacts or similar, outer surfaces of the device comprise cleaved reflecting surfaces, and those surfaces of each laser structure which form a border to another laser structure are antireflective.

15. An edge-emitting laser device with at least two laser structures arranged in one optical cavity wherein the laser structures are arranged substantially in an optical direction of propagation, the laser structures comprise active regions which are separately formed and electrically connected in series, outer surfaces of the device comprise cleaved reflecting surfaces, and those surfaces of each laser structure which form a border to another laser structure are antireflective, the device forming a DFB-laser.

16. An edge-emitting laser device with at least two laser structures arranged in one optical cavity wherein the laser structures are arranged substantially in an optical direction of propagation, the laser structures comprise active regions which are separately formed and electrically connected in series, outer surfaces of the device comprise cleaved reflecting surfaces, and those surfaces of each laser structure which form a border to another laser structure are antireflective, the device forming a DBR-laser.

* * * * *